United States Patent [19]
Sperry et al.

[11] Patent Number: 4,478,977
[45] Date of Patent: Oct. 23, 1984

[54] PHOTOPOLYMER DERIVATIVES OF POLYVINYL ALCOHOL

[75] Inventors: John A. Sperry, Abingdon; Dennis D. Maguire, Reading, both of England

[73] Assignee: Autotype International Limited, Wantage, England

[21] Appl. No.: 475,637

[22] Filed: Mar. 15, 1983

[30] Foreign Application Priority Data

Apr. 23, 1982 [GB] United Kingdom ................. 8211788

[51] Int. Cl.³ .............................................. G03C 1/68
[52] U.S. Cl. ................................. 525/61; 204/159.14; 204/159.22; 430/270; 430/281; 430/287; 430/28; 525/375
[58] Field of Search ................. 430/270, 281, 287, 28; 525/61, 375; 204/159.14, 159.22

[56] References Cited

U.S. PATENT DOCUMENTS 4,101,323 7/1978 Buhr et al. .......................... 430/270
4,339,524 7/1982 Ichimura et al. .................... 430/270
4,413,052 11/1983 Green et al. ......................... 430/270

Primary Examiner—Jack P. Brammer
Attorney, Agent, or Firm—Young & Thompson

[57] ABSTRACT

Photopolymers which are derivatives of polyvinyl alcohol and are useful as resists, stencils and relief images are made by reacting a compound having one or two formyl or acetal groups, such as terephthaldehyde, a naphthalene dialdehyde or the reaction product of an acetal and hydroxy-benzaldehyde, with an aromatic or heterocyclic compound carrying an acetyl group, so as to produce an intermediate of the formula:

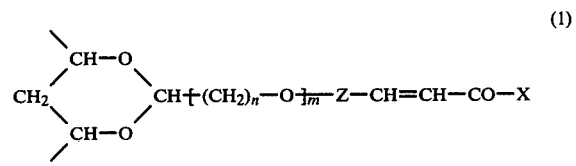

and reacting this with a polyvinyl alcohol to yield a photosensitive product of the formula:

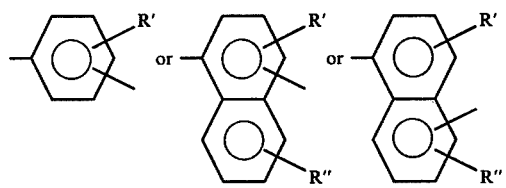

wherein m is 0 or 1, n is an integer from 1 to 6, X is an aromatic or heterocyclic group carrying at least one polar group and Z is an aromatic group of the formula:

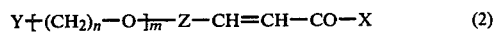

wherein R' and R", when both are present, are the same or different and each represents a hydrogen or a halogen atom or an alkyl, alkoxy, hydroxyalkyl, hydroxy, nitro or cyano group.

11 Claims, No Drawings

PHOTOPOLYMER DERIVATIVES OF POLYVINYL ALCOHOL

DESCRIPTION

The invention relates to photopolymers having a high degree of photosensitivity, and a marked solubility in water.

Photosensitive resin compositions have long been used in such applications as the preparation of various types of printing plates, as resists for subsequent plating or etching operations in the preparation of printed circuit boards, and for U.V.-curable inks and varnishes.

Water-soluble or water-processable resist materials are very desirable, because of the cheapness and safe handling properties at the preparation stage and the subsequent ease of processing after image-wise exposure.

There is also a recent interest in the use of water-soluble photopolymers as immobilisers for enzymes or living micro-organisms for the biological preparation of chemical products. Among various water-processable light-sensitive systems previously exploited, there may be mentioned:

(a) Dichromate-sensitised colloids

These are of limited utility, because of the toxicity of dichromate salts, the difficulty of effluent disposal and the limited stability of coated materials.

(b) Diazo Resins

These are condensation products of diazodiphenylamine and formaldehyde and may be prepared in a metal-free form. They are usually mixed with a suitable colloid and coated in that form; again, they have a limited shelf-life.

(c) Free-radical Systems

A considerable number of systems consisting of a photo-initiator, a cross-linking monomer and a suitable colloid are described in the literature. They suffer from oxygen-sensitivity and, in some cases, moisture-sensitivity.

(d) Photo-dimerisable Systems

These systems have very desirable properties, in that they are generally stable against the effects of heat, moisture and oxygen. They are best-known in the form of water-insoluble compounds, typified by polyvinyl cinnamate, which is widely used in commercial light-sensitive coatings.

Recently a photo-dimerisable resin has been described, which is produced by causing a styryl pyridine salt possessing a formyl group or an acetal group to react with polyvinyl alcohol. (GB-A-No. 2,030,575; GB-A-No. 2,076,826; J. Polymer Sci. Polymer Chem. Ed. 1980, 18, 891-902). These compounds are water-processable and rely upon the formation of micelles to impart high sensitivity to light at low levels of substitution.

A class of new polymeric materials having photosensitivity has now been discovered, which are eminently suitable in the areas of use mentioned, without having the various defects suffered by known water-processable systems.

According to the present invention, a photo-sensitive resin is provided which comprises a polyvinyl alcohol derivative which incorporates a constituent of the formula:

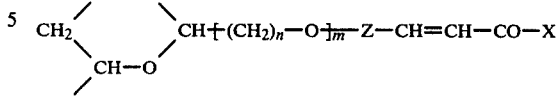

wherein m is 0 or 1, n is an integer from 1 to 6, X is an aromatic or heterocyclic group carrying at least one polar group and Z is an aromatic group of the formula:

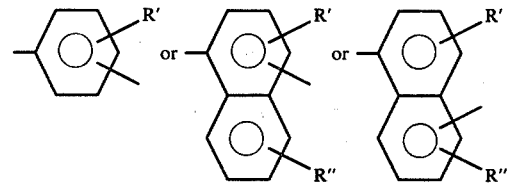

wherein R' and R", when both are present, are the same or different and each represents a hydrogen or a halogen atom or an alkyl, alkoxy, hydroxyalkyl, hydroxy, nitro or cyano group. Preferred examples of the polar group in the aromatic or heterocyclic group X include carboxylic acids and their salts, sulphonic acids and their salts and primary, secondary and tertiary amines and their salts, including quaternary salts of tertiary amines.

Examples of suitable structures of X include:

where R''' represents a hydrogen atom or an alkyl or hydroxyalkyl group, such as a $C_1$ to $C_{12}$ alkyl group or a $C_1$ to $C_8$ hydroxyalkyl group, and Y is a strong acid anion.

Of particular utility in the invention are those compounds where X consists of an aromatic or heterocyclic group substituted by a sulphonic acid group. When X consists of a substituted aromatic ring, the compounds are derivatives of chalcones. The simple chalcones are well-known to undergo cyclodimerisation reactions, when subjected to actinic radiation:

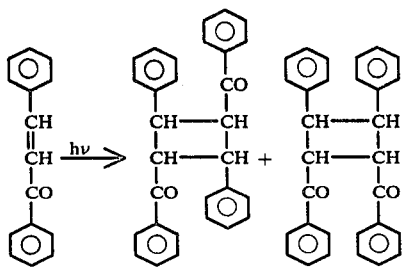

(L. Kulm et al, J. Amer. Chem. Soc. 1950, 72, 5053; R. E. O. Lutz et al, J. Amer. Chem. Soc. 1950, 72, 4090; J. K. Sugden, Synth. Comm. 1976, 6 (2), 93–101). It is presumed that the reaction undergone when the novel photopolymers herein described are subjected to actinic radiation is a similar cyclodimerisation.

To optimise the efficiency of the photopolymer, it is desirable for the light-absorption of the photosystem as nearly as possible to match the emission spectrum of the light-source used. It is of particular utility that the absorption properties of the class of photopolymers of the present invention lie in the range from about 320 nm to 500 nm and, moreover, that polymers within the class can be made which have, at least approximately, a predetermined absorbency for light of a given wavelength, by manipulation of the chemical structure of the chromophore. For example, if the photopolymer is of the Type 1 structure, as explained below, and has a λ max of 320 nm, a change to the Type 3 structure gives a bathochromic shift of about 40 nm, i.e. to a λ max of 360 nm. A change from a Type 1 structure to a Type 4 structure gives a bathochromic shift of about 80 nm, i.e. λ max to about 400 nm.

The structue of R' also has an effect, although much smaller, on the light-absorption properties of the chromophore. An appropriate choice of structure can therefore be made so that the absorption properties of the photopolymer very closely match the emission properties of lamps for any particular application, thus optimising the photographic speed of any coating derived therefrom.

The photopolymers of the invention and the intermediates used in preparing them can conveniently be regarded as falling within 1 or other of four types, according to the nature of the group —Z— in the general formula and the value of m, i.e. whether or not there is a —(CH$_2$)—O— group in the structure. Thus, the four types of structure of the photopolymers can be summarised as follows:

| | m | Z | |
|---|---|---|---|
| Type 1 | 0 | phenyl: | 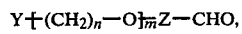 |
| Type 2 | 0 | naphthyl: | 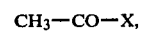 or 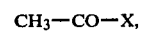 |
| Type 3 | 1 | phenyl: —(CH$_2$)$_n$—O— | |
| Type 4 | 1 | naphthyl: —(CH$_2$)$_n$—O— or —(CH$_2$)$_n$—O— | |

A change from one type of structure to another, in order to select the λ max at or about a specific value, thus involves the preparation and use of a photopolymer of the appropriate structure.

The polyvinyl alcohol can be any partially or fully hydrolysed grade of polyvinyl acetate and may therefore contain a number of acetyl groups.

The photopolymers can be produced by treating the partially or fully hydrolysed polyvinyl alcohol with a compound of the general formula:

$$Y+(CH_2)_n-O+_{\overline{m}}-Z-CH=CH-CO-X \qquad (2)$$

wherein Y is a formyl or acetal group and Z, X, n and m have the meanings defined above, under acid conditions; the preferred pH is 2.0.

The process of preparation of a photopolymer according to this invention is characterized in that a compound of the formula:

$$Y+(CH_2)_n-O+_{\overline{m}}Z-CHO,$$

wherein Y represents a formyl or acetal group and Z, n and m have the meanings defined above, is reacted with a compound of the formula:

$$CH_3-CO-X,$$

wherein X has the meaning defined above, and the product is condensed under acid conditions with polyvinyl alcohol. The polyvinyl alcohol is preferably dissolved in a suitable solvent, which is usually water, but may be a mixture of water and another suitable solvent. Examples of suitable acids include hydrochloric acid, sulphuric acid, phosphoric acid, methane-sulphonic acid, and para-toluene-sulphonic acid. The reaction may be carried out at a temperature in the range from room temperature (say 20° C.) to 100° C.; the preferred reaction conditions are 70° C. for 4 hours. The properties of the photopolymer may be further modified by the inclusion in the reaction mix of non-light-sensitive compounds containing formyl or acetal groups; these co-condense during the reaction and may be used to change such properties as solubility and adhesion of the final photopolymer. Examples of such modifiers include acetaldehyde, acetaldehyde-dimethyl-acetal, chloral and chloracetaldehyde-dimethyl-acetal.

The photopolymer may be separated by precipitation in a suitable solvent, for example, acetone. One of the great advantages of this invention is that it is not normally necessary to carry out this step; the reaction mixture can be used directly in many applications; the pH may be adjusted if necessary and the reaction mixture applied directly to a substrate to form a photo-resist.

Because the reaction involved when the polymers are used is photo-dimerisation, which causes cross-linking of the polymer chains on exposure to light, leading to efficient insolubilisation, the photo-reaction exhibits none of the problems normally found with alternative systems, viz oxygen or moisture sensitivity. Due to the formation of micelles, the photosensitive group needs to be present only in extremely low concentration to give a high degree of photo-sensitivity; the photopolymer therefore retains many of the properties of the original polyvinyl alcohol. One useful consequence of this is that the photo-crosslinked resist may easily be removed from a substrate by the application of aqueous periodate salts, as described in GB-B-No. 1,375,402.

The photopolymers described can be used in any photographic or photomechanical process where a resist or stencil or relief image is required, for example, as etching resists for printing plates and cylinders, nameplates, dials etc, as resists for plating processes, such as in the preparation of printed circuit boards, and as ink-accepting images for litho-graphic masters and stencils for silk-screen printing. The photopolymers are also very suitable for use as resists for the preparation of face-plates for cathode ray tubes, to be used, for example, in black and white or colour television sets.

The photopolymers of the invention have particular utility as immobilisers for enzymes or for living micro-organisms for the biological preparation of chemical products. This is because they may be photo-cross-linked under such mild conditions that only a minimum of damage to the biological entities ensues. In the various applications, typical ones being described above, the photopolymers may be internally modified, as described above, and/or may also be mixed with suitable pigments, fillers, resins or the like. For example, for use in the preparation of screens for screen-printing, improved results are obtained when the photopolymer is mixed with a suitable water dispersion of polyvinylacetate.

One of the principal benefits of the photopolymers herein described is that they are easily prepared in high yield from readily-available and generally inexpensive starting materials.

The following examples illustrate the reactions involved and also confirm their simplicity; the Examples are intended to indicate general methods of preparation of both intermediates (Examples 1 to 5) and the photopolymers per se (Examples 6 to 8).

PREPARATION OF INTERMEDIATES

Example 1

Part A—Type 1

Terephthaldehyde was reacted with a suitably-substituted acetophenone; firstly, terephthaldehyde (107.2 g, 0.8 m) was dissolved in ethanol with heating. The solution was cooled to 10° C. and 20% sodium hydroxide solution (160 cm$^3$) was added with stirring, producing a clear reddish yellow solution. A solution of p-acetylbenzene sulphonic acid, (sodium salt, 88.8 g, 0.4 m) in water was added, the temperature being maintained at 0°–5° C. The product was filtered off, dried and the solid extracted several times with ether to remove unreacted terephthaldehyde.

Yield: 170 g (76%); α max=320 nm.

Part B—Type 2

Using the same procedure as in Part A, the appropriate naphthalene-dialdehyde was employed instead of terephthaldehyde to give a product of the Type 2 structure.

Example 2

Type 3

Bromoacetaldehyde-diethyl-acetal was reacted with hydroxybenzaldehyde to give a quantitative yield of p-formylphenoxyacetaldehyde-diethyl-acetal. Reaction of this with acetylbenzene-sulphonic acid yielded 4-(2,2-diethoxy)ethoxy-4$^1$-sulphochalcone. A typical reaction procedure is as follows:

Bromoacetaldehyde-diethyl-acetal (98.5 g, 0.5 m) and p-hydroxybenzaldehyde (76.4 g, 0.63 m) were dissolved in N-methylpyrrolidone (250 cm$^3$) and heated at 120° for 12 hours. The reaction mixture was cooled, diluted with diethyl ether and the ether layer was extracted four times with 5% sodium hydroxide solution to remove excess of p-hydroxybenzaldehyde. The ether was removed and the product distilled under reduced pressure to give 115 g (97%) of p-formylphenoxy-acetaldehyde-diethyl-acetal, b. 139°–140°/1.5 mbs. Acetylbenzene-sulphonic acid (sodium salt, 40 g, 0.18 m) was dispersed in a mixture of methanol (400 cm$^3$) and 10% aqueous sodium hydroxide (150 cm$^3$).

To the stirred dispersion, 50 g (0.2 m) of the acetal, prepared as above, in 100 cm$^3$ of methanol was added dropwise. The reaction mixture was stirred for 1 hour after the final addition, the product was filtered, dried and the dry solid extracted several times with ether to remove excess of the formylphenoxyacetaldehyde-diethyl-acetal.

Yield: 72.5 g (91%); λ max=355 nm.

Example 3

Type 4

By using 2-hydroxyl-1-naphthaldehyde in place of the p-hydroxybenzaldehyde-diethyl-acetal in the above Example 2, 1-formyl-2-naphthoxyacetaldehyde-diethyl-acetal was formed and was recrystallised from cyclohexane and had a m.p. of 51° C. The final product had λ max of 410 nm.

Example 4

Type 3

When 4-acetylpyridine replaced the acetylbenzene sulphonic acid used in Example 2, the pyridine chalcone so formed was a solid having 80 max=370 nm.

Example 5

Type 4

When 4-acetylpyridine was condensed with 1-formyl-2-naphthoxyacetaldehyde, the resulting product had a λ max=430 nm.

It will be appreciated that in the above Examples, the products are intermediates for use in the preparation of photopolymers of the invention and the Type numbers indicated represent the photo-polymer structures given when the intermediates have been condensed with a partially or fully hydrolysed polyvinyl acetate or other form of polyvinyl alcohol.

PREPARATION OF PHOTOPOLYMERS

Example 6

To polyvinylalcohol ("Gohsenol" GLO8, 20 g) as a 10% aqueous solution was added 4-(2,2-diethoxy)- ethoxy-4¹-sulphochalcone (sodium salt, 6 g, 0.015 m, to give a maximum of 3% molar substitution) and the mixture was adjusted to pH 2.0 by the addition of hydrochloric acid. The substituted chalcone was prepared as described in Example 2. The mixture was heated at 70° for 3 hours, cooled and diluted to give a 5% aqueous solution. The solution was slowly added to 4 l of acetone, in order to precipitate the photopolymer. The product was washed several times with ammoniacal methanol, to neutralise any excess acid, and dried. ("Gohsenol" is a Regd. Trademark of Nippon Gohsen Ltd).

The dried polymer was dissolved in water to give a 10% aqueous solution and a film having 200 microns wet thickness was coated on to "Melinex AS" polyester film. The coating was dried and exposed to a 2 kw actinic light in a "Nu-Arc Flip-Top" unit, at a distance of 75 cm (30") from the lamp for 15 secs through a photographic positive containing a 0.15 density increment step-wedge. Development in cold water gave 7 steps on the wedge and a thick, strong photo-resist in the other exposed areas ("Melinex" is a Regd. Trademark of ICI Ltd).

Example 7

This illustrates that it is not necessary to purify the photopolymer before use. A mixture of polyvinylalcohol (GL-08, 15% solids), 4-formyl-4¹-sulphochalcone (2.5 g per 20 g POVH, w/w) and polyvinylacetate homopolymer dispersion ("Vinamul" 8440, 50% on POVH w/w) was adjusted to pH 2.5 and immediately coated on to "Melinex AS" polyester film on a pilot coating machine, using a drying temperature of 80° C. The dried film was exposed on a "Flip-Top" unit, and at 4 minutes exposure gave, on development with water, a 9 step on the 0.15 density increments step-wedge. The wet photopolymer image was very robust and the dry thickness of the exposed photopolymer image was 10 microns. After ageing the film at 50° C. for 48 days, the same result was obtained on exposure and development, indicating the excellent stability of the system. ("Vinamul" is a Regd. Trademark of Vinyl Products Ltd).

We claim:

1. A photopolymer, characterized by comprising a polyvinyl alcohol derivative which incorporates a constituent of the formula:

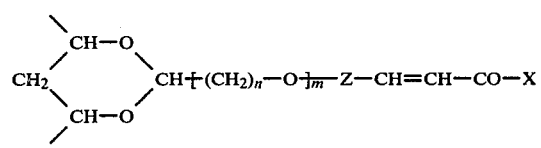

(1)

wherein m is 0 or 1, n is an integer from 1 to 6, X is an aromatic or heterocyclic group carrying at least one polar group and Z is an aromatic group of the formula:

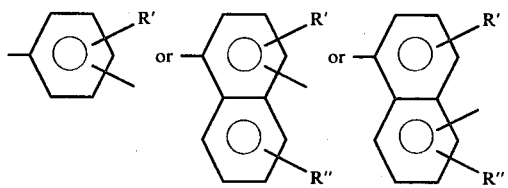

wherein R' and R'', when both are present, are the same or different and each represents a hydrogen or a halogen atom or an alkyl, alkoxy, hydroxyalkyl, hydroxy, nitro or cyano group.

2. A photopolymer according to claim 1, which is capable of absorbing light of a wavelength in the range from 320 nm to 500 nm.

3. A photopolymer according to claim 1, wherein the polar group in X is selected from carboxylic acids and their salts, sulphonic acids and their salts and primary, secondary and tertiary amines and their salts, including quaternary salts of tertiary amines.

4. A photopolymer according to claim 3, wherein X is selected from structures of the formulae:

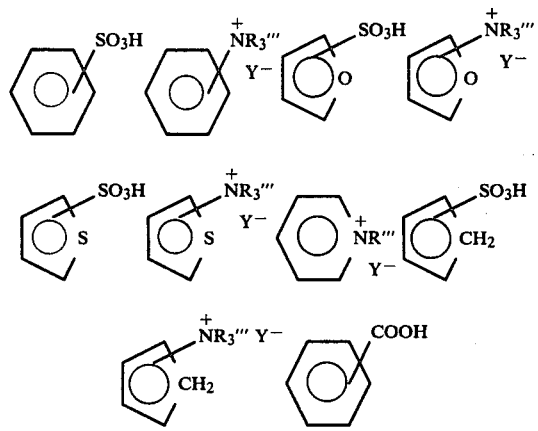

wherein R''' represents a hydrogen atom or an alkyl or hydroxyalkyl group and Y is a strong acid anion.

5. A photopolymer according to claim 1, wherein m is 0, X is a benzenesulphonic group or a salt thereof and R' and R'' each represent a hydrogen atom.

6. A photopolymer according to claim 1, wherein m is 1, X is a benzenesulphonic group or a salt thereof and R' and R'' each represent a hydrogen atom.

7. A photopolymer according to claim 1, wherein m is 1, X is a pyridyl group or a quaternary salt thereof and R' and R'' each represent a hydrogen atom.

8. A photopolymer according to claim 1, which is the product of reaction of a polyvinyl alcohol with an intermediate of the general formula:

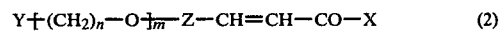

(2)

wherein Y is a formyl or acetal group and Z, X, n and m have the meanings defined in claim 1.

9. A photopolymer according to claim 8, which has been prepared from a reaction mixture which also contains one or more non-light-sensitive modifier compounds containing formyl or acetal groups.

10. A photopolymer according to claim 9, wherein the modifier compound is selected from acetaldehyde, acetaldehyde-dimethyl-acetal, chloral and chloracetaldehyde-dimethyl-acetal.

11. A process of preparation of a photopolymer of formula (1) as defined in claim 1, characterized in that a compound of the formula:

$$Y \mathrm{-\!\!\!-\!\!(CH_2)}_n \mathrm{-\!\!O\!\!-\!\!]_m} Z \mathrm{-\!\!CHO},$$

wherein Y represents a formyl or acetal group and Z, n and m have the meanings defined in claim 1, is reacted with a compound of the formula:

$$CH_3 \mathrm{-\!\!CO\!\!-\!\!X},$$

wherein X has the meaning defined in claim 1, and the product is condensed under acid conditions with polyvinyl alcohol.

* * * * *